United States Patent
Yin et al.

(10) Patent No.: US 10,168,357 B2
(45) Date of Patent: Jan. 1, 2019

(54) COATED PROBE TIPS FOR PLUNGER PINS OF AN INTEGRATED CIRCUIT PACKAGE TEST SYSTEM

(71) Applicant: INTEL CORPORATION, Santa Clara, CA (US)

(72) Inventors: Wen Yin, Chandler, AZ (US); Anna M. Prakash, Chandler, AZ (US); Teag R. Haughan, Chandler, AZ (US); Dingying David Xu, Chandler, AZ (US); Joaquin Aguilar-Santillan, Gilbert, AZ (US)

(73) Assignee: Intel Corporation, Santa Clara, CA (US)

( * ) Notice: Subject to any disclaimer, the term of this patent is extended or adjusted under 35 U.S.C. 154(b) by 141 days.

(21) Appl. No.: 14/976,808

(22) Filed: Dec. 21, 2015

(65) Prior Publication Data

US 2017/0176495 A1    Jun. 22, 2017

(51) Int. Cl.

| | |
|---|---|
| *G01R 1/067* | (2006.01) |
| *C25D 3/54* | (2006.01) |
| *C25D 7/00* | (2006.01) |
| *C25D 5/50* | (2006.01) |
| *C23C 8/20* | (2006.01) |

(Continued)

(52) U.S. Cl.
CPC ...... *G01R 1/06761* (2013.01); *C11D 11/0047* (2013.01); *C22F 1/183* (2013.01); *C23C 8/20* (2013.01); *C25D 3/54* (2013.01); *C25D 5/34* (2013.01); *C25D 5/50* (2013.01); *C25D 7/00* (2013.01); *G01R 1/06722* (2013.01)

(58) Field of Classification Search
CPC ............... G01R 1/067; G01R 1/06722; G01R 1/06761; G01R 1/06755; G01R 31/02; G01R 31/26
See application file for complete search history.

(56) References Cited

U.S. PATENT DOCUMENTS 6,198,300 B1 *   3/2001   Doezema ............... B82Y 35/00
                                              324/755.07
6,208,155 B1 *   3/2001   Barabi ................. G01R 1/0466
                                              324/750.25

(Continued)

FOREIGN PATENT DOCUMENTS

JP       2013-196924      9/2013
WO   WO 2015-153063     10/2015

OTHER PUBLICATIONS

PCT International Search Report and Written Opinion of the International Searching Authority for International Application No. PCT/US2016/056662, dated Jan. 10, 2017, 12 pages.

(Continued)

*Primary Examiner* — Son T Le
(74) *Attorney, Agent, or Firm* — Schwabe, Williamson & Wyatt, P.C.

(57) ABSTRACT

Coated probe tips are described for plunger pins of an integrated circuit package tests system. One example has a plunger having a tip to contact a solder ball of an integrated circuit package, a sleeve to hold the plunger and allow the plunger to move toward and away from the package, the sleeve being held in a socket, a spring within the sleeve to drive the plunger toward the package, and a coating over the tip, the coating being harder than a solder ball.

2 Claims, 6 Drawing Sheets

(51) Int. Cl.
  *C22F 1/18* (2006.01)
  *C25D 5/34* (2006.01)
  *C11D 11/00* (2006.01)

(56) References Cited

U.S. PATENT DOCUMENTS

| | | | |
|---|---|---|---|
| 6,307,620 B1* | 10/2001 | Takabayashi | G03F 7/707 355/53 |
| 9,625,492 B2* | 4/2017 | Hirano | G01R 1/06738 |
| 2001/0020545 A1* | 9/2001 | Eldridge | B23K 20/004 174/260 |
| 2004/0104739 A1 | 6/2004 | Haga et al. | |
| 2009/0289648 A1 | 11/2009 | Lamson et al. | |
| 2013/0049784 A1 | 2/2013 | Hirano et al. | |
| 2014/0176174 A1* | 6/2014 | Preston | G01R 31/2886 324/754.11 |

OTHER PUBLICATIONS

English Abstract of JP 2013-196924, Sep. 30, 2013, Oda Takahiro, et al., 1 page.
International Preliminary Report on Patentablity for International Patent Application No. PCT/US2016/056662, dated Jul. 5, 2018, 10 pages.

* cited by examiner

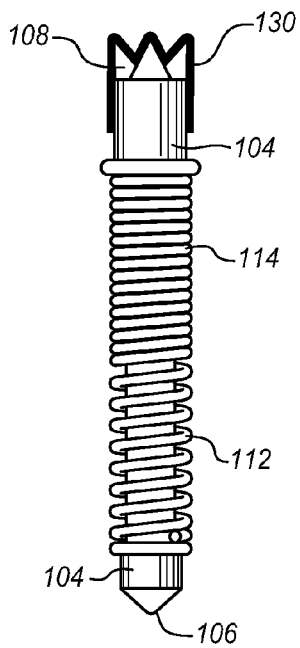
FIG. 5
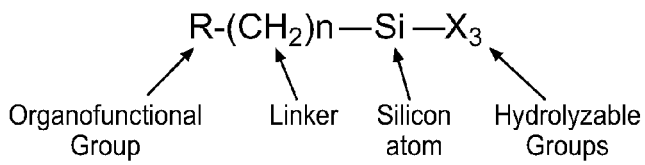
FIG. 6
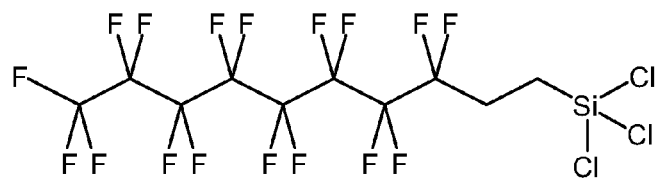
FIG. 7
FIG. 8
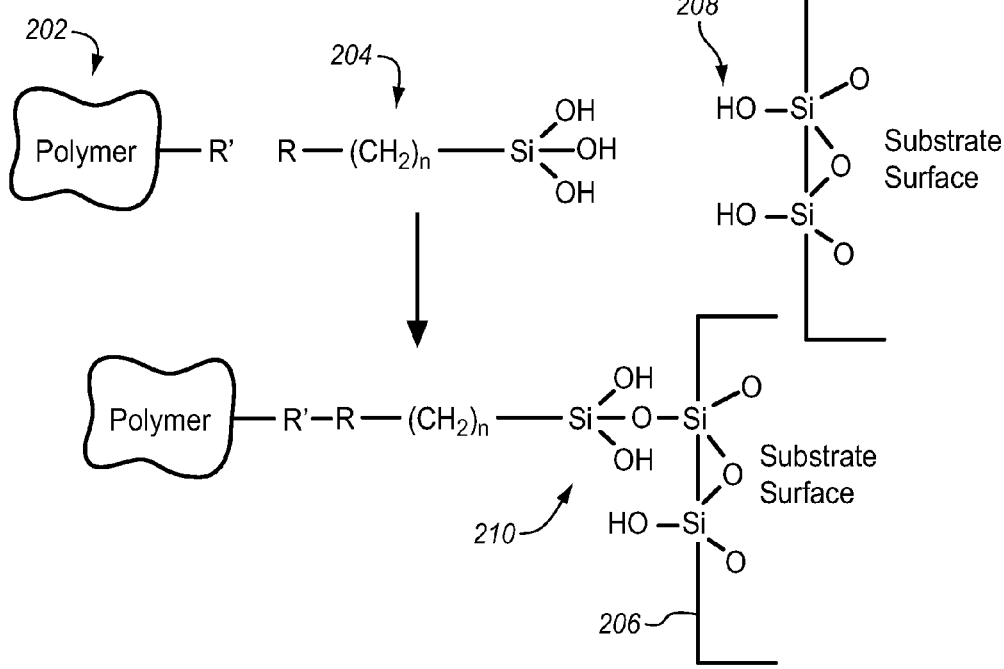

COATED PROBE TIPS FOR PLUNGER PINS OF AN INTEGRATED CIRCUIT PACKAGE TEST SYSTEM

FIELD

The present disclosure relates to integrated circuit test using a probe array and, in particular, to forming the tips of the probes.

BACKGROUND

In the manufacture of microelectronic devices, such as processors, controllers, and memory, the desired structures are formed on a wafer. Individual dies are cut from the wafer and then sealed into a package. The package has an array of pins, pads, or lands that make contact with the rest of the device, typically through a printed circuit board to allow the die to be operated while within the package. After packaging, each package is tested to ensure that it has been manufactured correctly and operates as intended.

To perform the tests, the packages may have lands, pads, or balls specifically designed into the package for test purposes. There is also an array of contacts that are used for normal operations. These are often, but not always, in the form of solder balls. Spring loaded pins or probes are applied to the lands or balls and signals are sent or received through the pins to test the die.

The test probes are in the form of spring and sleeve connectors in which one or both ends of the probe are spring-loaded to apply pressure against the electrical contacts of the package. One common type of spring loaded probe is referred to as a pogo pin. The test probes are mounted to a circuit board or attached to a substrate in a socket that holds each cylinder in the proper position with respect to each other probe so that when the package is pressed against the socket, each probe will contact its respective ball or pad. The probes are spring loaded and have a shaped tip so that when the probes are pressed against the package the pressure will stress and break through any oxide that has formed on the surface of the solder or other material of the electrical contact to ensure a good electrical connection.

The tip of each spring and sleeve connector wears with each new contact and may also collect contaminants from the package connection. As a result, each test probe has a limited number of contacts and therefore a limited number of package tests that it can perform. After which the test probe is replaced. With thousands of test probes in each socket, test probe replacement is a factor in the cost of die manufacturing.

BRIEF DESCRIPTION OF THE DRAWINGS

Embodiments of the invention are illustrated by way of example, and not by way of limitation, in the figures of the accompanying drawings in which like reference numerals refer to similar elements.

FIG. 5 is a side view diagram of the plunger-based test probe of FIG. 1 showing a hard shell coating on the tip according to an embodiment.

FIG. 6 is a formula of a hard shell coating according to an embodiment.

FIG. 7 is a formula for coupling agent for a hard shell coating according to an embodiment.

FIG. 8 is a diagram of bonding a hard shell coating to a test probe tip according to an embodiment.

DETAILED DESCRIPTION

Figure 2:
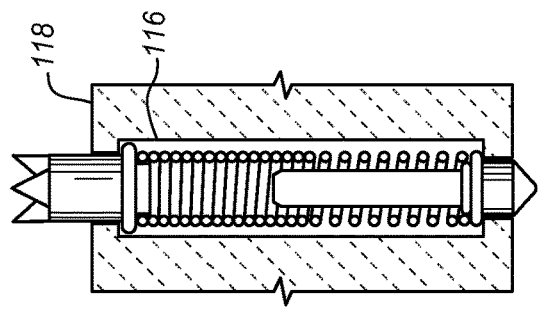
FIG. 2 is a cross-sectional side view diagram of the plunger-based test probe of FIG. 1 showing the sleeve and spring according to an embodiment.
Figure 1:
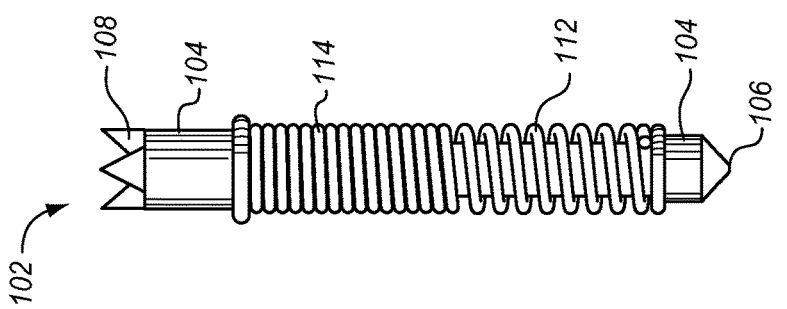
FIG. 1 is a side view diagram of a plunger-based test probe according to an embodiment.

FIG. 1 is a side view diagram of one embodiment of a spring loaded plunger, test probe, or pogo pin. The probe 102 has a main plunger body 104 or cylinder that is partially inside a threaded sleeve 114. The cylinder is longer than the sleeve and reciprocates within the sleeve. A spring 112 is attached to the cylinder and the sleeve to drive the cylinder in a particular direction, in this case downwards as shown. The cylinder has a bottom tip 106 for contacting a pusher plate 120 and a top tip 108 for contacting a solder ball 122 of a ball grid array or any other type of connection array of an integrated circuit package 124. The illustrated test probe is provided as an example, a variety of different types and modifications of test probes may be used FIG. 2 is a cross-sectional side view diagram of the spring loaded plunger to show the sleeve and cylinder test probe mounted to a socket body 118 and fixed in place within the socket. In this example, the test probe is carried in a housing 116. The sleeve threads are screwed into the housing to hold the sleeve and the housing is attached to the socket using an adhesive or another suitable attachment technique. FIG. 2 shows the test probe at rest where the spring drives the cylinder down. The illustrated attachment technique is provided as an example. Any of a variety of other attachment systems, structures, and techniques may be used to attach the test probe.

Figure 4:
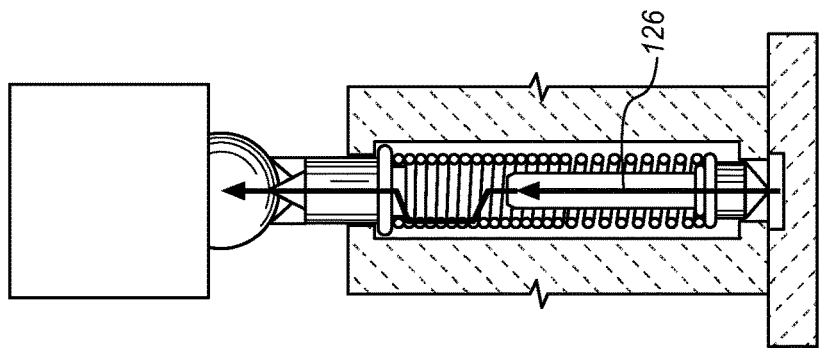
FIG. 4 is a cross-sectional side view diagram of the plunger-based test probe of FIG. 1 showing contact with an electrical contact and current flow through the test probe according to an embodiment.
Figure 3:
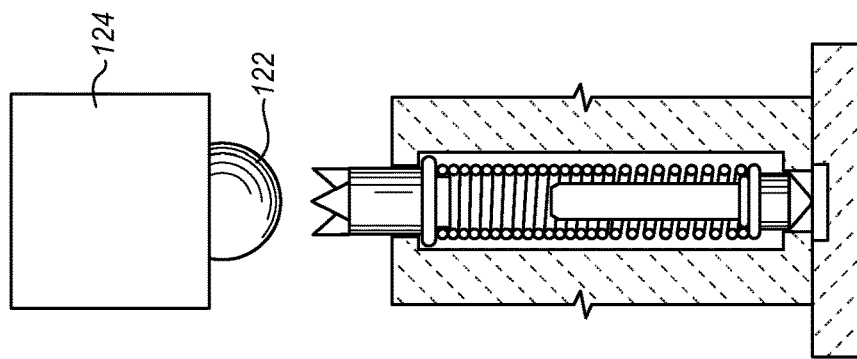
FIG. 3 is a cross-sectional side view diagram of the plunger-based test probe of FIG. 1 showing the plunger raised by a lower pusher plate according to an embodiment.

FIG. 3 is a side cross-sectional view diagram of the test probe 102 after a pusher plate 120 is pressed upward against the bottom tip 106. This drives the cylinder upward toward a solder ball or other connector 122 of a package 124. FIG. 4 is a side cross-sectional view diagram in which the top tip 108 of the test probe 102 is pushed against the package contact 122. The top cylinder tip 108 is driven into and penetrates the solder ball. The top tip may be driven through other materials that have been deposited over the solder ball either intentionally or as a result of some other process that has been performed on the package. As shown there is an electrical current flow 126 through the cylinder and the sleeve to the package contact. This allows test signals to be sent and received through the test probe.

The pogo pin is composed of plungers on both ends acting as contact surfaces, springs in the middle providing stroke and contact pressure control, and a barrel to fix both parts together. The plunger material is usually made of metal or metal alloy with Ni/Au coating in some cases. As shown in FIG. 1, the tip of plunger can be manufactured into different shapes (a crown shape in the case in FIG. 1) to provide a stable contact with the unit. In the case of a BGA package, the plunger needs to penetrate into the solder ball to provide good electrical conductivity.

The pogo pin is used for many different testing functions, including burn in, class test, and system test. Because there are thousands of pins per socket, although only one is shown, the pins represent a significant part of the cost of unit interface tooling (UIT). As the plunger repeatedly presses against and penetrates the solder ball, there are several different mechanisms that wear and contaminate the tip of the pogo-pin.

Typical plunger or cylinder materials include Pd alloy, steel, or Cu/Be alloy. In some cases, Au/Ni layers are coated over the tip to provide oxidation protection and improve electrical conduction. With repeated cycling, the plunger can degrade and become dulled, leading to an ineffective contact between the test pin tip 108 and the tested unit 122. There may be an increase in the contact resistance (Cres) at the tip of the test pin. An initially sharp shape becomes dulled and no longer penetrates the solder ball. In addition, any coating layers may be worn off.

In addition, each time the pogo pin tip contacts a new package contact, it will pick up contaminants. Sn and SnO are among the most common contaminants that a tip can pick up from a solder ball. In addition, with the increasing use of NCP (no clean paste) for BGA packages, a substantial amount of organic residue (mostly rosin) remains on the solder ball and can be transferred to the pogo pin tip. This can cause a socket open failure. The contaminants can be controlled by cleaning. However regular cleaning is very expensive. It takes the tool out of service. It takes time and money to perform and it wears the tip. Mechanical rubbing, for example, can accelerate pogo-pin wearing, and speed up pin degradation failures. Two results of the cleaning are first that the Cres is improved by cleaning but second that the Cres increases increases in general as with use of a pin over time.

A new class of packages uses molding compound and silica. Some complex 3D packaging technologies use through mold interconnects (TMI). Top side solder balls on TMIs can be covered with molding compound and silica filler. These are both much harder than the normal tips of a pogo-pin material and harder than the normal coating. This increases the wear on the pins still more.

As shown in FIG. 5, a low surface energy and hard coating 130 may be applied to the plunger tip 108. An appropriate coating can effectively prevent contamination of the tip and slow the wear. There are a few suitable coatings that provide low surface energy and sufficient hardness simultaneously. The described coatings are able to be applied in a practical way that prolongs the useful life of a test probe whether a pogo pin or another spring plunger probe. The coatings are both smoother and harder. Being smoother reduces the friction between the plunger and device under test (DUT), reducing wear still more.

The lower surface energy coatings as described herein decrease the amount of organic residue picked up from a solder ball by a probe tip. This reduces the cleaning cost, which reduces down time and wear. Both ceramic and organic coatings may be used to prevent tin of a solder ball from forming a solid solution on the tip of the plunger. Tin residue on a plunger tip is currently impossible to clean. The tin residue speeds up degradation of the plunger tip by increasing the roughness and porosity of the surface of the plunger tip. In some embodiments, instead of cleaning or replacing a test probe, the plunger tip can be recoated multiple times during its use cycle. This further reduces the cost of maintaining a working unit interface tool.

In some embodiments an organic coating based on a silane coupling agent may be used over the plunger tip. A low surface energy organic coating prevents the tip of the spring loaded plunger from picking up both organic and tin contaminants and reduces the cleaning frequency. Although the described organic coatings are not as hard as some ceramics, wear is also reduced by alleviating surface friction, by lubricating the tip surface.

FIG. 6 is a diagram of a basic structure for a suitable coating which in this case is a silane coupling agent on an inorganic material. As shown, an organofunctional group (R) is coupled to a linker ($CH_2$) which is coupled to silicon (Si) which is coupled to hydrolyzable groups ($X_3$). As shown a silane coupling agent may have two classes of functionality. The hydrolyzable group (X) may be alkoxy, acyloxy, halogen or amine. Following hydrolysis, a reactive silanol group is formed, which can condense with other silanol groups, for example, those on the surface of siliceous fillers, to form siloxane linkages ($CH_2$). Stable condensation products are also formed with other oxides on popular plunger probe tip metals such as steel and copper. Any of a variety of other alkyl or perfluro carbon based silane coupling agents may be used for this tip coating.

FIG. 7 is a diagram of a suitable proposed fluorinated silane for this application perfluorodecyl-1H,1H,2H,2H-Trichlorosilane. This particular silane forms a low surface energy coating of fluorinated carbon on either a steel or a copper plunger probe tip surface.

FIG. 8 is a diagram of a coupling reaction to a pogo pin 206 with this silane coupling agent. The silane coupling agent 204 is applied over a polymer 202 and the coated polymer is applied to the tip of the pogo pin's conductive surface 206. The pogo pin 206 surface is a conductive metal such as titanium, steel, or copper. It is coated with a silicon oil with hydroxide or hydroxyl groups (HO) that bond to the silicon. The silicon attaches to oxides (O) on the metal surface. As the polymer and coupling agent are brought into contact with the coated pogo pin tip, the hydroxyl (OH) groups interact with the surface materials and couple the silicon groups together to form a bond between the polymer and the tip through the silane coupling agent. This provides a high durability and lubricated tip surface. As the tip is driven into solder balls or metal contact pads, the polymer provides a smoother entry with less wear to the tip. As the coating wears away, it may be reapplied to protect the pogo pin tip through more test cycles.

Figure 9:
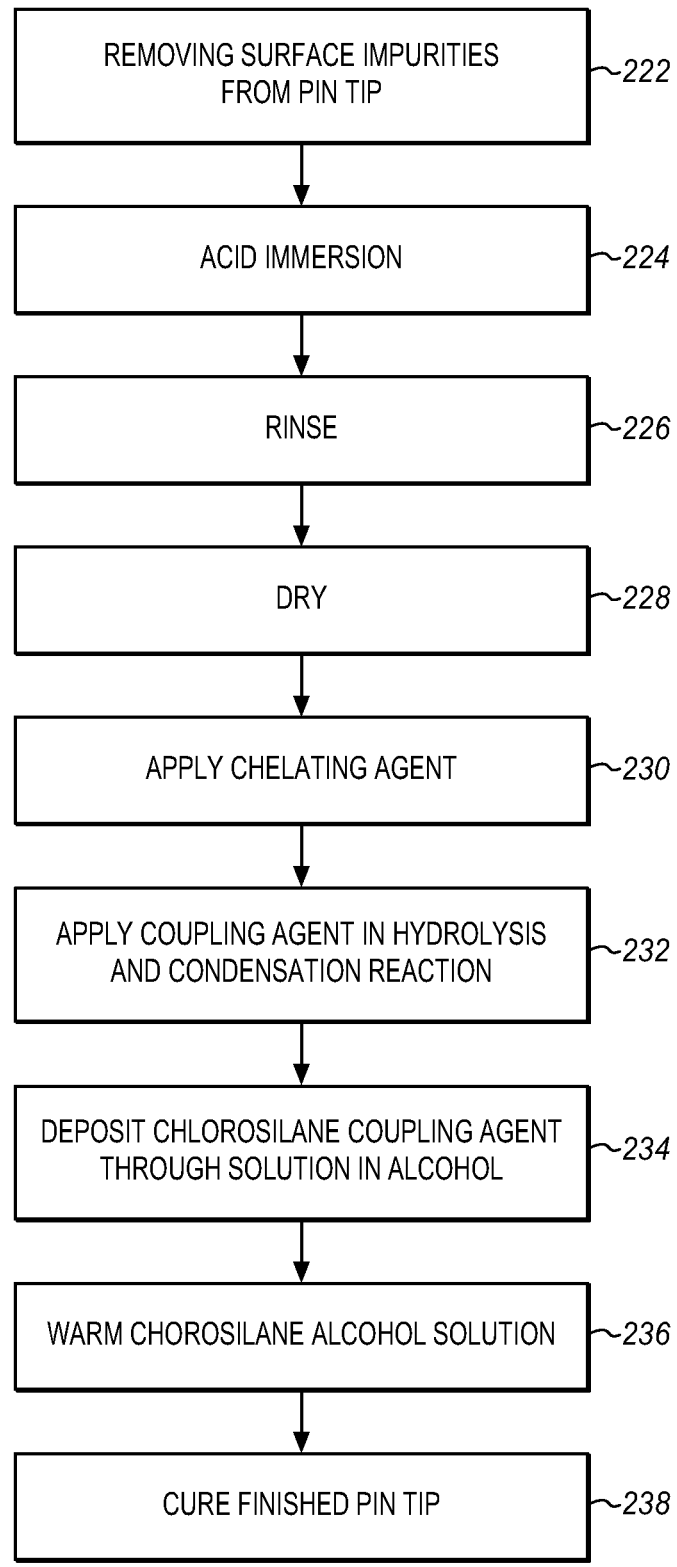
FIG. 9 is a process flow diagram of bonding a hard shell coating to a test probe tip according to an embodiment.

FIG. 9 is a process flow diagram for an example of applying an organic coating to the tip of a plunger pin or similar type of resilient probe. This process may be applied as an initial coating and may also be repeated to recoat the probe tips as the coating wears. First at 222 the surface impurities are removed. At 224 non-bonding metal ions are eliminated using an acid immersion. Ions such as sodium, potassium and calcium are collected by the probe tips from the surface of the substrates of the DUTs. These ions are removed to help ensure stable bonds for the organic coating. These and other surface impurities may be reduced by immersion in, for example, a 5% hydrochloric acid solution for 4 hours. The acid immersion 224 may be followed by a deionized water rinse 226, and then immersion in deionized water for several hours followed by drying at 228.

At 230 a chelating agent is applied. Metal oxides of iron or copper tend to dissolve in water or form a passive oxide layer with poor mechanical strength. As a result a steel or copper probe tip tends to develop a rough and imperfect oxide layer. This layer will interfere with a bond for the organic coating. A chelating agent such as amine or polycarboxylic acid may be used to remove this oxide. The chelating agent may be combined with a coupling agent, such as the fluorinated silane mentioned above in a hydrolysis and condensation reaction.

At 234 a coupling agent, such as the chlorosilane coupling agent mentioned above, may be deposited on the probe tip. The probe tip is now thoroughly cleaned of ion impurities and metal oxides so that the organic coating will bond well to the steel or copper tip. A similar process may be used for other tips of metal tips. In one example, a 2-5% chorosilane solution in alcohol is used to deposit the coating, followed by mild warming 236 of the solution to 30-40° C. After this treatment the probe tips may be cured at 238. The curing may be done in a variety of different way including 5-10 minutes at 110° C. or for many hours at room temperature.

By recoating before the silane coating is completely worn, the cleaning operations are rendered more effective. While there are several steps and the process may take one or more days to complete, the cost of a silane solution coating is extremely low. Millions of pogo-pins may be coated with a kilogram of material. The pins may also be coated while connected to a test interface unit so that thousands of pins may be treated at the same time. Such a fluorinated carbon coating has a low surface energy, has low resistivity, and is durable.

Instead of an organic coating, a variety of different ceramic materials may also be used, such as metal oxide ceramics. Several coating materials are hard enough to resist wearing and sufficiently electrically conductive. A thick coating improves durability but with some materials a thick layer compromises the overall electrical conductivity of the test probe. Tungsten carbide, tungsten carbide cobalt, and titanium diboride are metal oxide ceramics that are particularly suitable ceramic coating options with good hardness (about 2000 Kg/mm$^2$) and low electrical resistivity.

Tungsten carbide or tungsten carbide cement with cobalt is typically used as a drill bit coating in industry because of its anti-wearing performance. Titanium diboride, possesses excellent electrical conductivity with a resistivity of $2\times10^{-8}$ Ω·m, almost matching that of Cu. Tungsten carbide materials are close to titanium diboride at $2\times10^{-7}$ Ωm.

On the other hand, the Pd alloy material used as the normal coating of pogo pin tips has a hardness of about 300 which is softer than the SnO or silica filler that is often present on the surfaces of solder balls. When the plunger tip penetrates a solder ball, it must be pushed through or around these materials. This penetration applies a high degree of wear to a Pd alloy tip.

Pogo pins with a fluorinated carbon coating have a much slower degradation with use and much lower increase in resistivity. The resistivity increases as the tip becomes covered in residues picked up from repeated solder ball penetration. In addition to a superior anti-wearing performance, the coated pogo-pin has a higher contact angle and retains its low surface energy. This in part explains the slower degradation of resistivity because the low surface energy reduces the amount of organic residue like rosin picked up by the pin.

Ceramic coatings such as those described above may be applied through heat treatments. Unlike other ceramic coating methods like plasma enhanced CVD (Chemical Vapor Deposition), or flame coating, heat treatment of metal is not only lower cost but presents less risk of harming a pin. In some embodiments, each pogo pin or the entire TIU is treated in a fluidizing gas of the metal oxide under heat. This provides a consistent coating layer thickness.

Figure 10:
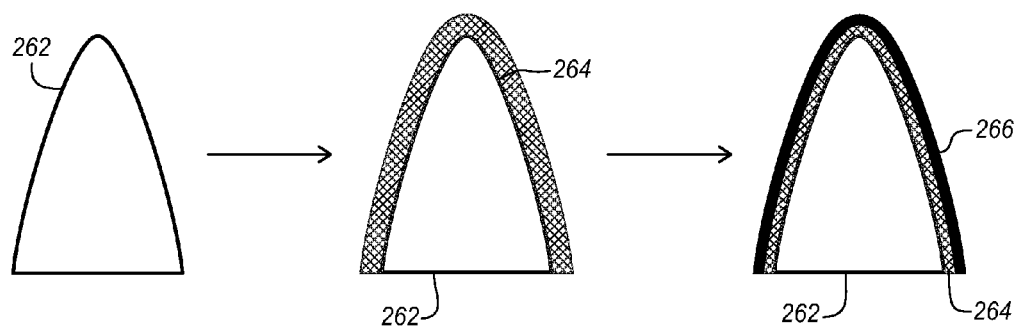
FIG. 10 is a diagram of processing stages for bonding a hard shell coating to a test probe tip according to an embodiment.

FIG. 10 is a diagram of a coating process for a probe tip. While the probe tip is shown as having a simple rounded point, the same process may be applied to many different tip shapes. In brief, depending on the choice of bulk material, the coating can be applied by direct heat treatment or a thermal treatment followed by a plating of corresponding metal.

In the illustrated example, the tip 262 is first electro-plated to form an initial thin plating 264 over the surface of the tip. After electroplating a thermal treatment is applied. This converts an outer portion of the electro-plated material to a harder more durable state. In some cases, this is a ceramic outer layer.

After the electroplating, the tip is thermally treated to convert some of the metal to a ceramic coating 266 over the remaining electro-plated metal coating. The thermal treatment may be done in a variety of different ways. The tip may first be carburized by exposing the pogo-pins tips to a CO gas under elevated temperature, (such as around 900-1000° C.). This will impregnate an electro-plated tungsten or tungsten cobalt layer with carbon to form the tungsten carbide ceramic materials mentioned above.

For the titanium diboride, after a titanium electroplate layer has been applied, a carburizing process may be used using a boriding mixture such as boron carbide. By controlling temperature, heat treatment time, and gas flow or mixture loading level, the carbide or boride thickness may be controlled. For a copper tip, a barium electro-plating may be used among others, followed by a tungsten carbide or tungsten diboride coating.

As with the organic coating, the ceramic coating may be applied to thousands of probe tips at the same time reducing test equipment down time and the cost per pin.

Figure 11:
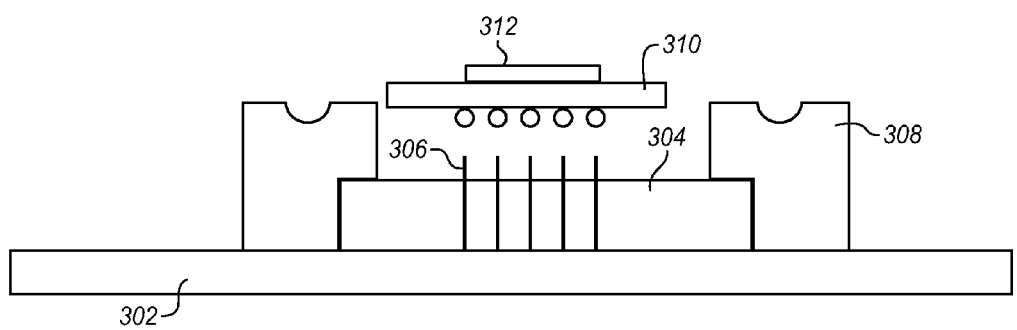
FIG. 11 is a cross-sectional side view diagram of a test socket using plunger-based test probes and a device under test according to an embodiment.

FIG. 11 is a cross-sectional side view diagram of test equipment incorporating plungers with contact tips, such as pogo pins as described herein. A test interface printed circuit board (PCB) provides an interface between an attached socket body 304 and external test control equipment (not shown). The socket body is enclosed on all sides by a socket frame 308 which includes alignment guides 309 to guide the top side contact and device under test (DUT) into the socket.

The DUT 310 is lowered down into the socket body and pressed into the socket body by a top side contact plate 312. The top side contact plate makes physical contact with the top side of the DUT and also makes any electrical contacts that may be useful for a test. The DUT has a contact array 314 such as an LGA (Land Grid Array), BGA (Ball Grid Array), SMT (Surface Mount Technology), or any other suitable array of pads, land or solder balls. The socket body carries an array of plungers 306. As the DUT is pressed against the plungers, the plunger tips are pressed into the contact array 314 to make electrical contact with the contacts of the DUT. This allows the test equipment to apply voltages and other types of test signals to the DUT and to also read outputs from the DUT. A typical DUT may have hundreds or thousands of contacts and the socket may have a corresponding number of plungers.

Figure 12:
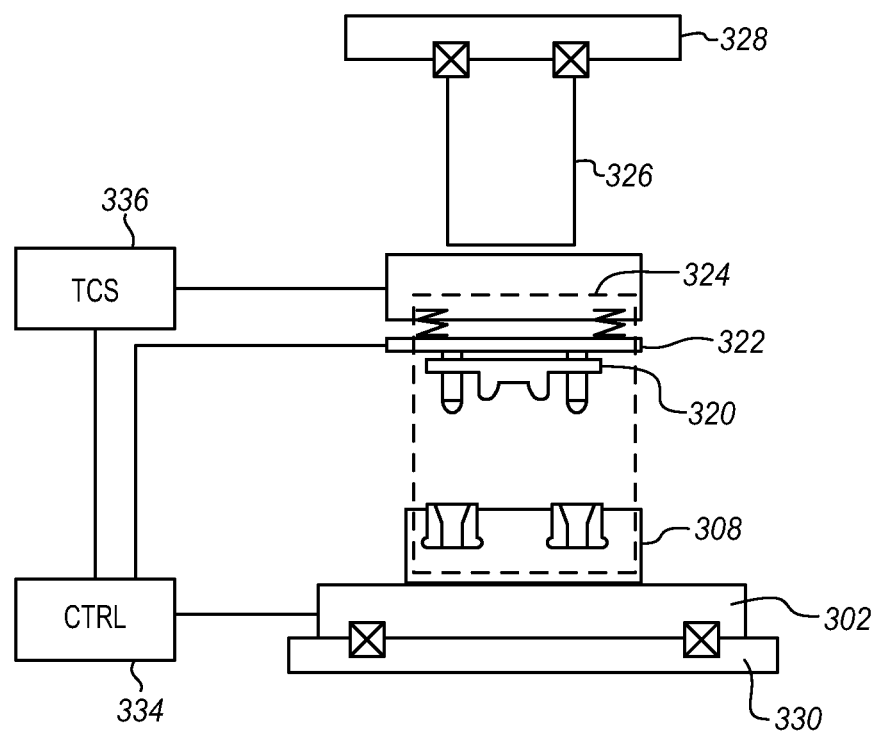
FIG. 12 is a side view diagram of a test fixture using the test socket of FIG. 11 according to an embodiment.

FIG. 12 is a side plan view diagram of a test fixture including the socket and DUT of FIG. 11. The socket body and frame are integrated into a bottom side contact 308 with alignment guides 309. These are mounted on a printed circuit board 302 that is mounted to a bottom plate 330. The DUT (not shown) is mounted to a top side contact 320 that includes guide pins 321 that mate with the alignment guides of the socket. The top side contact is pressed against the bottom side contact with a pusher plate 322. The pusher plate is within a thermal control unit (TCU) head 324. The TCU head is attached to a TCU mount 326 that is attached to a top plate 328. Moving the top plate drives the TCU mount and the TCU head down toward or up away from the socket. The pusher plate 322 provides a stiffening reinforcement to press the DUT against the many plungers.

In addition to a pusher plate and connections to the top side connector 320, the TCU head also has a thermal control system 336, such as heaters, coolers, or both to regulate the temperature of the DUT during test. The TCU and the bottom side PCB are coupled to a controller 334 to control test signals, thermal conditions, power supply and other aspects of testing the DUT.

Figure 13:
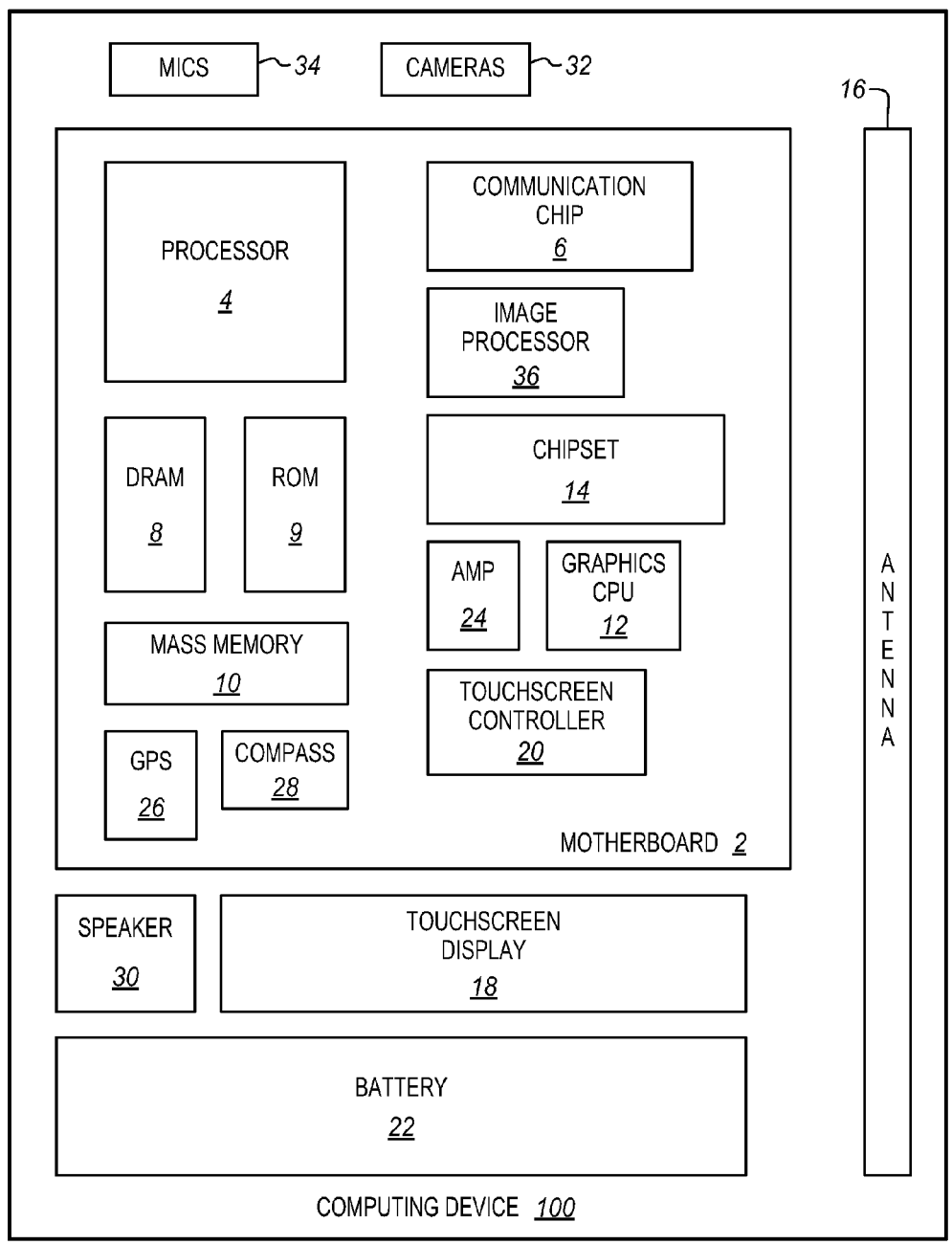
FIG. 13 is a block diagram of a computing device suitable for use with embodiments.

FIG. 13 illustrates a computing device 500 in accordance with one implementation of the invention. The computing device 500 houses a board 502. The board 502 may include a number of components, including but not limited to a processor 504 and at least one communication chip 506. The processor 504 is physically and electrically coupled to the board 502. In some implementations the at least one communication chip 506 is also physically and electrically coupled to the board 502. In further implementations, the communication chip 506 is part of the processor 504.

Depending on its applications, computing device 500 may include other components that may or may not be physically and electrically coupled to the board 502. These other components include, but are not limited to, volatile memory (e.g., DRAM) 508, non-volatile memory (e.g., ROM) 509, flash memory (not shown), a graphics processor 512, a digital signal processor (not shown), a crypto processor (not shown), a chipset 514, an antenna 516, a display 518 such as a touchscreen display, a touchscreen controller 520, a battery 522, an audio codec (not shown), a video codec (not shown), a power amplifier 524, a global positioning system (GPS) device 526, a compass 528, an accelerometer (not shown), a gyroscope (not shown), a speaker 530, a camera 532, and a mass storage device (such as hard disk drive) 510, compact disk (CD) (not shown), digital versatile disk (DVD) (not shown), and so forth). These components may be connected to the system board 502, mounted to the system board, or combined with any of the other components.

The communication chip 506 enables wireless and/or wired communications for the transfer of data to and from the computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 506 may implement any of a number of wireless or wired standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, Ethernet derivatives thereof, as well as any other wireless and wired protocols that are designated as 3G, 4G, 5G, and beyond. The computing device 500 may include a plurality of communication chips 506. For instance, a first communication chip 506 may be dedicated to shorter range wireless communications such as Wi-Fi and Bluetooth and a second communication chip 506 may be dedicated to longer range wireless communications such as GPS, EDGE, GPRS, CDMA, WiMAX, LTE, Ev-DO, and others.

The processor 504 of the computing device 500 includes an integrated circuit die packaged within the processor 504. In some implementations of the invention, the packages that include the processor, memory devices, communication devices, or other components may be tested using coated plunger pins as described herein, if desired. The computing device may also be used as the controller 334 when outfitted with suitable interfaces. The term "processor" may refer to any device or portion of a device that processes electronic data from registers and/or memory to transform that electronic data into other electronic data that may be stored in registers and/or memory.

In various implementations, the computing device 500 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 500 may be any other electronic device that processes data.

Embodiments may be adapted to be used with a variety of different probe wires, probe heads, and devices under test using various types of testing equipment for different implementations. References to "one embodiment", "an embodiment", "example embodiment", "various embodiments", etc., indicate that the embodiment(s) of the invention so described may include particular features, structures, or characteristics, but not every embodiment necessarily includes the particular features, structures, or characteristics. Further, some embodiments may have some, all, or none of the features described for other embodiments.

In the following description and claims, the term "coupled" along with its derivatives, may be used. "Coupled" is used to indicate that two or more elements co-operate or interact with each other, but they may or may not have intervening physical or electrical components between them.

As used in the claims, unless otherwise specified, the use of the ordinal adjectives "first", "second", "third", etc., to describe a common element, merely indicate that different instances of like elements are being referred to, and are not intended to imply that the elements so described must be in a given sequence, either temporally, spatially, in ranking, or in any other manner.

The drawings and the forgoing description give examples of embodiments. Those skilled in the art will appreciate that one or more of the described elements may well be combined into a single functional element. Alternatively, certain elements may be split into multiple functional elements. Elements from one embodiment may be added to another embodiment. For example, the specific location of elements as shown and described herein may be changed and are not limited to what is shown. Moreover, the actions of any flow diagram need not be implemented in the order shown; nor do all of the acts necessarily need to be performed. Also, those acts that are not dependent on other acts may be performed in parallel with the other acts. The scope of embodiments is by no means limited by these specific examples. Numerous variations, whether explicitly given in the specification or not, such as differences in structure, dimension, and use of material, are possible. The scope of embodiments is at least as broad as given by the following claims.

The following examples pertain to further embodiments. The various features of the different embodiments may be variously combined with some features included and others excluded to suit a variety of different applications. Some embodiments pertain to an apparatus that includes a plunger having a tip to contact a solder ball of an integrated circuit package, a sleeve to hold the plunger and allow the plunger to move toward and away from the package, the sleeve being held in a socket, a spring within the sleeve to drive the plunger toward the package, and a coating over the tip, the coating being harder than a solder ball.

In further embodiments the coating is an organic coating with a silane coupling agent.

In further embodiments the organic coating is a fluorinated carbon coating.

In further embodiments the coating is a metal oxide ceramic.

In further embodiments the metal oxide ceramic comprises tungsten carbide.

In further embodiments the metal oxide ceramic comprises titanium diboride.

In further embodiments the coating is lower surface energy than the solder ball.

In further embodiments the coating is an electro-plated titanium that is heat treated to form an other ceramic oxide coating over the titanium.

Some embodiments pertain to an integrated circuit test fixture that includes a socket body having a plurality of plunger-based test probes, each having a tip to contact a contact of an integrated circuit to be tested, a thermal head to control the thermal test conditions of the integrated circuit to be tested, and a controller to drive electrical signals through the test probes to test the integrated circuit to be tested, wherein the tips have a coating that is harder than a solder ball.

In further embodiments the coating is a fluorinated carbon coating bonded to the test probe with a silane coupling agent.

In further embodiments the coating is a titanium electroplate with a titanium diboride carburized outer layer.

Some embodiments pertain to a method that includes removing surface impurities from a tip of a plunger of a test probe of an integrated circuit package testing test interface unit, chelating the tip, and applying a chlorosilane coupling agent over the chelated tip.

In further embodiments removing surface impurities comprise acid immersion and rinsing.

In further embodiments chelating comprises applying a chelating agent together with a silane coupling agent in a hydrolysis and condensation reaction.

In further embodiments applying a chlorosilane comprises applying a fluorinated silane to form a fluorinated carbon on the tip.

Some embodiments pertain to a method that includes plating a tip of a plunger of a test probe of an integrated circuit package testing test interface unit with a metal, carburizing the metal to form a metal oxide ceramic over the tip.

In further embodiments the metal comprises tungsten, tungsten cobalt, or titanium.

In further embodiments carburizing comprises heating the tip and exposing the tip to a CO gas.

In further embodiments plating comprises electroplating and wherein carburizing further comprises exposing the tip to cobalt.

In further embodiments carburizing further comprises exposing the tip to boron carbide.

What is claimed is:

1. An apparatus comprising:
   a plunger having a tip to contact a solder ball of an integrated circuit package;
   a sleeve to hold the plunger and allow the plunger to move toward and away from the package, the sleeve being held in a socket;
   a spring within the sleeve to drive the plunger toward the package; and
   a coating over the tip, the coating having an inner portion and an outer portion, the outer portion being harder than a solder ball, and the inner portion softer than the outer portion, wherein the coating is an electro-plated titanium that is heat treated to form a ceramic oxide coating over the titanium.

2. The apparatus of claim 1, wherein the coating is lower surface energy than the solder ball.

* * * * *